United States Patent [19] | [11] 4,375,623
Franssen, deceased et al. | [45] Mar. 1, 1983

[54] ARRANGEMENT FOR THE TRANSMISSION OF AUDIO SIGNALS

[75] Inventors: Nico V. Franssen, deceased, late of Knegsel, Netherlands; by Friedrich J. de Haan, administrator, Dommelen, Netherlands; Kornelis A. Immink, Eindhoven, Netherlands; Eise C. Dijkmans, Eindhoven, Netherlands; Mathias H. Geelen, Eindhoven, Netherlands

[73] Assignee: U.S. Philips Corporation, New York, N.Y.

[21] Appl. No.: 237,309

[22] Filed: Feb. 23, 1981

[30] Foreign Application Priority Data

Feb. 25, 1980 [NL] Netherlands ........................ 8001118

[51] Int. Cl.[3] ........................ H03H 7/18; H03H 7/30
[52] U.S. Cl. .................................... 333/138; 333/166
[58] Field of Search .............. 333/138, 165, 166, 28 R

[56] References Cited

U.S. PATENT DOCUMENTS 3,829,798 8/1974 Byram et al. ...................... 333/166
3,860,892 1/1975 Speiser et al. ...................... 333/166

*Primary Examiner*—Marvin L. Nussbaum
*Attorney, Agent, or Firm*—Bernard Franzblau; Robert T. Mayer

[57] ABSTRACT

An arrangement for the transmission of audio signals, comprising a delay line (1) provided with 5, 7 or 9 tappings situated at equal time intervals along the delay line. The tappings are each connected to a common adding circuit (16) *via* an amplitude control device (9 to 13). The ratios between the amplitudes of the output signals of the amplitude control devices, viewed from one end of the delay line (1) to the other end are $1:2n:2n^2:-2n:1$ for five tappings, $1:2n:2n^2:n^3-n:-2n^2:2n:-1$ for seven tappings, and $1:2n:2n^2:n^3-n:\frac{1}{4}(n^4-1)-2n^2:-(n^3-n):2n^2:-2n:1$ for nine tappings. This yields an arrangement having a flat frequency response from the input (2) to the output (15). The invention also relates to a plurality of delay lines (for example 31 to 35) connected in series and to a reverberation unit provided with such a transmission arrangement.

23 Claims, 9 Drawing Figures

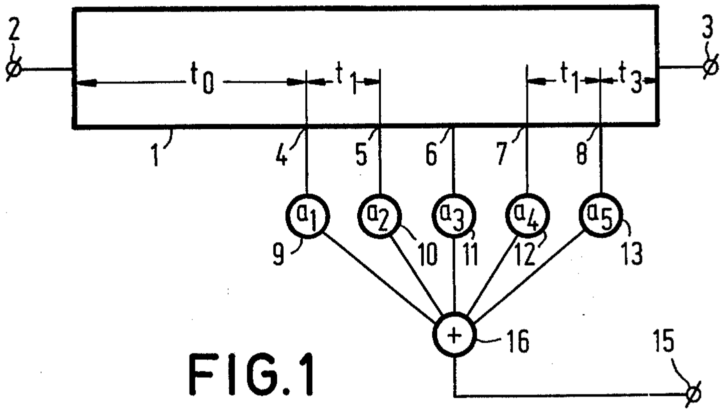
FIG.1
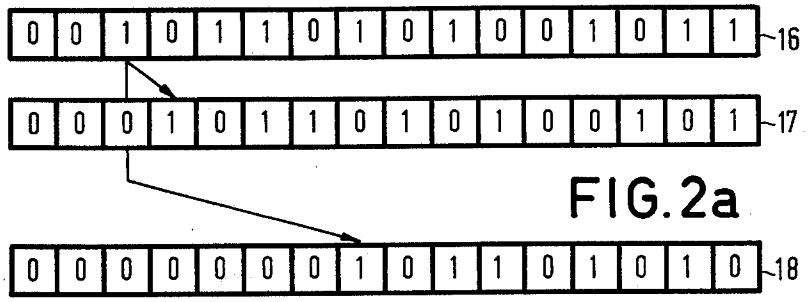
FIG.2a
FIG.2b
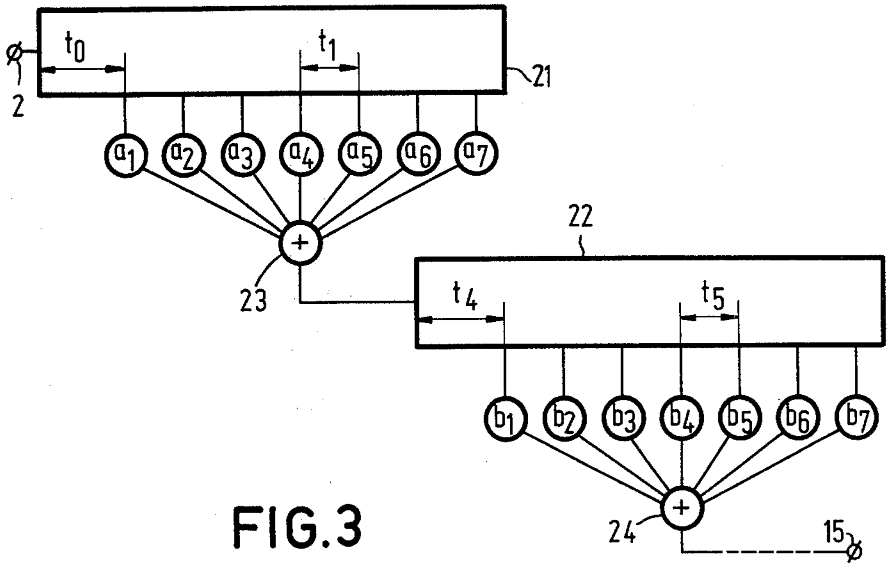
FIG.3

ARRANGEMENT FOR THE TRANSMISSION OF AUDIO SIGNALS

The invention relates to an arrangement for the transmission of audio signals comprising a delay line provided with an input, an output and $(2k+1)$ tappings ($k$ being an integer and $2 \leqq k \leqq 4$), which tappings are situated at equal time intervals ($t_1$) and are each connected to a common adding circuit via a first amplitude control device. The amplitudes of the signals at the outputs of said first amplitude control devices which are connected to tappings which are situated symmetrically relative to the central tapping have equal values. The phase shifts in the first amplitude control devices are the same, but the phase shift in one of every two of said first amplitude control devices which are situated at equal odd multiples of the time interval ($t_1$) from the central tapping differ by 180° from that in the other and the amplitudes of said signals are selected so that the transmission by the arrangement is at least approximately frequency-independent. The invention also relates to a reverberation unit provided with such an arrangement in accordance with the invention. An arrangement of the type mentioned in the preamble is known from Netherlands Patent Specification No. 112,868.

The ratios between the amplitudes of the signals at the outputs of the amplitude control devices are chosen in the known arrangement to accord with the coefficients of the Bessel function of the first kind and with an argument corresponding to half the largest odd number of tappings in the arrangement minus three. Because of this, the arrangement can supply an output signal whose amplitude, when signals of constant amplitude but arbitrary frequency are applied to the arrangement, is substantially frequency-independent.

The known arrangement has the drawback that, especially if the delay line is a digital delay line (shift register) or a charge transfer device, for example a bucket brigade or charge-coupled device, the Bessel coefficients to be used for the various amplitude control devices yield inconvenient values, which are often difficult to realize by digital or analogue means, so that the arrangement can be realized only with very intricate digital or analogue circuits.

It is an object of the invention to provide an arrangement which, while maintaining the advantages of the known arrangement, is much simpler to realize, in that the arrangement comprises p such delay lines ($p \geqq 1$) and that when an index x (x being an integer $\leqq k+1$) is assigned to a number of tappings of each delay line, the index 1 being assigned to one of the extreme tappings, consecutive indices to consecutive adjacent tappings, proceeding from said extreme tapping to the central tapping, and the highest index to the central tapping, the ratios between the output signals of the amplitude control devices $A_x$ associated with said tappings, including their signs, satisfy the equation:

$$A_1:A_2:A_3:A_4:A_5 = 1:2n:2n^2:n^3-n:\tfrac{1}{4}(n^4-1)-2n^2,$$

in which n, k and $t_1$ may have identical values for each delay line.

By limiting the number of tappings of one delay line to a maximum of 9 and selecting the ratios between the signal amplitudes in accordance with the specified equation, an arrangement which is very simple to realize can be obtained, which nevertheless exhibits a substantially frequency-independent transmission.

It is to be noted that n is not necessarily an integer. Suitably, a small value will be selected for n because in that case all tappings contribute substantially equally to the output signal of the common adding circuit. Moreover, it has been assumed in the foregoing that the delay line itself exhibits a frequency-independent transmission from the input to the various tappings.

An embodiment of the arrangement in accordance with the invention may comprise at least two delay lines, the input of each consecutive delay line being connected to the output of the common adding circuit of the delay line which precedes it. By arranging at least two delay lines in the manner described, the time intervals between the tappings of the two delay lines can be selected differently so that unequal time delays can be realized, and the arrangement still exhibits a frequency-independent transmission characteristic.

A second embodiment of the arrangement in accordance with the invention is characterized in that the arrangement comprises $2l+1$ series-connected identical delay lines ($l$ being an integer and $2 \leqq l \leqq 4$), the input of each consecutive delay line being connected to the output of the delay line preceding it, and the outputs of the adding circuits of the $(2l+1)$ delay lines being individually provided with a second amplitude control device. The output of each second amplitude control device is connected to a further common adding circuit, the amplitudes of the output signals of said second amplitude control devices of delay lines which are disposed symmetrically relative to the central delay line having equal values and the phase shifts in the second amplitude control devices being equal, but the phase shift in one of every two of said second amplitude control devices situated at equal odd multiples of the time interval ($t_2$), which corresponds to the time interval between the central tappings of two consecutive delay lines, from the central tapping of the central delay line differing by 180° from that in the other, and that when an index x (x being an integer $\leqq l+1$) is assigned to a number of delay lines, the index 1 being assigned to one of the extreme delay lines, consecutive indices to consecutive adjacent delay lines, proceeding from said extreme delay line to the central delay line, and the highest index to the central delay line, the ratios between the output signals of the second amplitude control devices $B_x$ associated with said delay lines including their signs, satisfy the equation $$B_1:B_2:B_3:B_4:B_5 = 1:2m:2m^2:m^3-m:\tfrac{1}{4}(m^4-1)-2m^2.$$

The principle of the invention is now applied to an arrangement provided with 5, 7 or 9 identical delay lines which, in the manner described in the foregoing, are connected in series with each other. The overall transmission is then found to be substantially independent of the frequency.

In a further embodiment of the said arrangement in accordance with the invention the $2l+1$ delay lines are combined into one delay line with $2l+1$ groups of $2k+1$ tappings. This makes it possible to combine the delay lines in such a way that the time interval $t_2$ becomes smaller than the sum of the time intervals between the central tapping and the extreme tapping of two adjacent delay lines, so that a much shorter total delay time in the arrangement and consequently less components for the delay lines are needed.

In another arrangement in accordance with the invention n is equal to 1 for a said delay line. The ratios between the output signals of the amplitude control devices in the arrangements provided with a delay line having 5, 7 or 9 tappings are then 1:2:2:−2:1; 1:2:2:0:−2:2:−1 and 1:2:2:0:−2:0:2:−2:1 respectively. Such an arrangement has the advantage that the amplitudes of said signals do not differ excessively in magnitude and that owing to the simple ratio between them the amplitude control devices can be simplified and in the case of digital signals the multiplications and/or divisions can be performed by shifting the bits one position.

Another embodiment of an arrangement in accordance with the invention is characterized in that a delay line comprises 7 tappings and that the output signals of the first amplitude control devices, viewed from one end of the delay line to the other end, are in the ratio of 1:8:24:32:−24:8:−1.

A further embodiment of the arrangement is characterized in that at least one delay line comprises 7 tappings and the output signals of the first amplitude control devices, viewed from one end of the delay line to the other end, are in the ratio of 1:4:12:16:−12:4:−1.

Yet another embodiment is characterized in that at least one delay line has 7 tappings and that the output signals of the first amplitude control devices, viewed from one end of the delay line to the other end, are in the ratio of 3:13:32:32:−32:13:−3. The advantage of these ratios is that, especially in the case of digitized signal transmission, the multiplications and/or divisions can be performed by shifting the bits one or more positions, corresponding to the relevant powers of 2 in the ratios.

In one arrangement in accordance with the invention with 21+1 series-connected delay lines m is 1. The ratios between the output signals of the second amplitude control devices are then 1:2:2:−2:1 for five delay lines, 1:2:2:0:−2:2:−1 for seven delay lines, and 1:2:2:0:−2:0:2:−2:1 for nine delay lines. Such arrangements have the advantage that the amplitudes of the signals do not differ excessively in magnitude and that owing to the simple ratios between them the second amplitude control devices can be simplified and, in the case of digital signals, the multiplications and/or divisions can be performed by shifting the bits one position.

Another embodiment of said arrangement is characterized in that the arrangement comprises 7 delay lines and that the output signals of the second amplitude control devices, viewed from one end to the other end, are in the ratio of 1:8:24:32:−24:8:−1.

A further embodiment of said device is characterized in that the arrangement comprises 7 delay lines and that the output signals of the second amplitude control devices, viewed from one end to the other end, are in the ratio of 1:4:12:16:−12:4:−1.

Yet another embodiment of said arrangement is characterized in that the arrangement comprises 7 delay lines and that the output signals of the second amplitude control devices, viewed from one end to the other end, are in the ratio of 3:13:32:32:−32:13:−3. The advantage of these ratios is that, in particular in the case of digitized signal transmission, the multiplications and/or divisions can be performed by shifting the bits one or more positions, corresponding to the relevant powers of 2 in the ratios.

A reverberation unit is characterized in that there is provided an arrangement in accordance with the invention, a signal being applied to a first input of a combination unit, while the output of the combination unit is connected, as the case may be via an additional delay line, to the input of the arrangement, the output of the arrangement being connected, as the case may be with the inclusion of an amplifier stage, to a second input of the combination unit. By feeding the output signal of the arrangement back to the input of the arrangement, the output of the arrangement being constituted by the output of the adding circuit associated with the (last) delay line or the output of the further common adding circuit of the arrangement, a desired reverberation is obtained. In order to prevent instabilities, the loop gain should be smaller than unity. This results in reflections which decay in time, which gives the impression of reverberation.

A special embodiment of a reverberation unit in accordance with the invention, provided with an arrangement with at least two delay lines, the output of each consecutive delay line being coupled to the output of the common adding circuit associated with the delay line preceding it, is characterized in that the arrangement comprises 2 delay lines, each provided with 7 tappings, the time interval between the tappings of the one delay line being unequal to that of the other delay line, and the output of the common adding circuit of the second delay line constituting the output of the arrangement.

By selecting the two time intervals associated with the two delay lines to be unequal, a desired increase in the echo density can be realized. This yields a very faithful simulation of three-dimensional reverberation, i.e. reverberation in a three-dimensional space such as a concert hall. By means of the reverberation unit a very rapid square-law increase of the number of reflections per unit of time is obtained, which gives the impression of three-dimensional reverberation. By simple feedback of the output signal of the arrangement, however, a reverberation unit is obtained which exhibits a frequency-dependent transmission.

A further embodiment of the reverberation unit in accordance with the invention is characterized in that the output of the combination unit is connected, as the case may be via a further amplifier stage, to a first input of a further combination unit, and the output of the arrangement is connected, as the case may be via another amplifier stage, to a second input of the further combination unit at whose output the output signal is available. This yields a reverberation unit which moreover exhibits a frequency-independent transmission characteristic. A requirement for this is that the loop gain, viewed from the input of the reverberation unit via the arrangement and the feedback circuit to the second input of the combination unit, is equal to but of a sign opposite to the ratio between the gain in the path from the input of the reverberation unit to the first input of the further combination unit and the gain in the path from the input of the reverberation unit via the output of the arrangement to the second input of the further combination unit. In the case of a suitable choice for the values of the output signals of the amplitude control devices, this moreover yields the advantage that the feedback circuit to the second input of the combination unit can be realized without an amplifier or attenuator.

Yet another embodiment of a reverberation unit in accordance with the invention, provided with an arrangement having a delay line with (2k+1) tappings, is characterized in that there is provided an arrangement in accordance with the invention provided with one delay line with two identical groups of 2k+1 tappings together with associated amplitude control devices and adding circuits, the output of the common adding circuit of the first group being connected, as the case may be via an amplifier stage, to the second input of the combination unit, and the output of the common adding circuit of the second group being connected, as the case may be via a further amplifier stage, to a first input of a further combination unit, the output of the delay line being connected, as the case may be via another amplifier stage, to a second input of the further combination unit, at whose output the desired signal is available, that the ratios between the output signals of the amplitude control devices of one group, viewed from the input of the delay line, are equal to the ratios between the output signals of the amplitude control devices of the other group, viewed from the output, and the time interval between the input of the delay line and the first tapping of the one group is equal to the time interval between the last tapping of the other group and the output of the delay line. The application of the output signal of the common adding circuit of the second group to the first input of the further combination unit, which also in this case is intended for flattening the frequency response curve of the reverberation unit, is obtained by again applying the principle of the invention to the second group of (2k+1) tappings along the delay line. Also in this case a flat frequency response curve is obtained if the loop gain, viewed from the input of the reverberation unit, via the arrangement and the feedback circuit, to the second input of the combination unit, is equal to but of a sign opposite to the ratio of the gain between the input of the reverberation unit and the first input of the further combination unit to the gain between the input of the reverberation unit and the second input of the further combination unit via the delay line. Moreover, in the case of a suitable choice for the values of the output signals of the amplitude control devices of the first and the second group, the advantage is obtained that both the feedback circuit to the second input of the first combination unit and the path to the first input of the further combination unit may be realized without amplifiers or attenuators.

The invention will now be described in more detail with reference to the drawings in which:

FIG. 1 shows an arrangement provided with a delay line having five tappings.

FIG. 2*a* illustrates division of a 16-bit binary number by 2 and FIG. 2*b* the division of the same number by 32.

FIG. 3 shows an arrangement provided with two or more delay lines.

Figure 4:
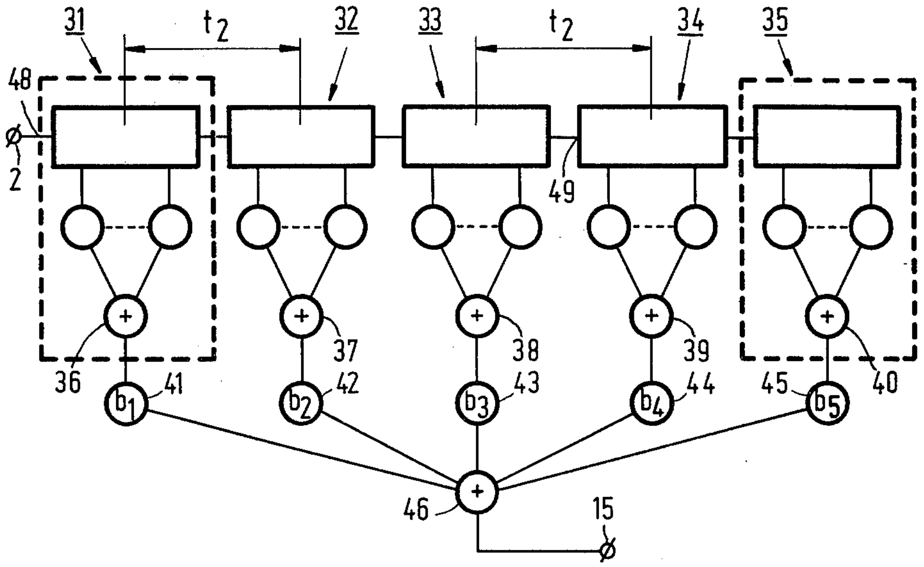
FIG. 4 shows an arrangement provided with five delay lines.

The arrangement of FIG. 1 is provided with a delay line 1 having an input 2 to which an audio frequency signal is applied and an output 3 and five tappings 4 to 8 for taking a signal off the delay line. The tappings 4 to 8 are situated at equal delay intervals $t_1$ along the delay line. The delays between the input 2 of the delay line and the first tapping 4 ($t_0$) and between the last tapping 8 and the output 3 of the delay line ($t_3$) may be arbitrary. The tappings 4 to 8 are each connected to an output 15 of the arrangement via a respective amplitude control device 9 to 13 and an adding circuit 16. The elements 9 to 13 amplify or attenuate the signals from the corresponding tappings 4 to 8 by the respective factors $a_1$ to $a_5$ and may be constituted by analogue or digital amplifiers or attenuators.

The factors $a_1$ to $a_5$ have been selected so that the amplitudes of the signals at the outputs of the amplitude control devices, viewed from one end of the delay line to the other end, are in the ratio of $1:2n:2n^2:-2n:1$. If a signal with a flat frequency spectrum is applied to input 2, then a signal with a substantially flat frequency characteristic appears at the output 15. The minus sign denotes that the phase shift in the associated amplitude control device differs 180° from those in the other devices. It is not strictly necessary that n is an integer. Suitably, n is not selected too high, and is selected for example equal to 1. The ratios then become $1:2:2:-2:1$. If these numbers are divided by the highest value, being 2, this yields $\frac{1}{2}:1:1:-1:\frac{1}{2}$. If analogue signals are digitally transmitted in the arrangement, this means that the (digitally represented) amplitudes of the signals on the tappings 5, 6 and 7 need neither be amplified nor attenuated and that the amplitudes on the two outer tappings should be divided by 2. This division is very simple by digital means. Assume, for example, that the analogue signal amplitudes are represented by 16-bit binary numbers. The delay line 1 may then comprise 16 parallel shift-registers. Each tapping, for example 4, taps one bit of the binary number out of each of the 16 shift registers and sets this number in a 16-bit shift-register associated with the amplitude control device. One tapping, for example 4, thus in principle carries a 16-bit binary number, as is shown at 16 in FIG. 2*a*. The bit on the extreme left is the most significant bit. The bit on the extreme right is the least significant bit. Division by two now means that the binary number is shifted one position in the direction of the least significant bit. This is shown at 17 in FIG. 2*a*. Thus, the multiplications/divisions can be effected by very simple shifting operations, which makes the circuits very simple to realize. It is alternatively possible to effect division by off-setting the tappings of the outputs relative to the inputs of the register associated with an amplitude control device (which register is only a storage register now) one position in the direction of the most significant bit, and attributing the value "0" to the most significant bit of the binary number at the output of said register.

The arrangement shown in FIG. 1 may alternatively be provided with 7 tappings. The ratios between the amplitudes of the signals at the outputs of the amplitude control devices are then $$1:2n:2n^2:n^3-n:-2n^2:2n:-1 \qquad (1)$$

Preferably, a small value is selected for n.

(i) If n is selected to be 1, formula (1) yields the ratios $$1:2:2:0:-2:2:-1$$

If these numbers are divided by the largest value that occurs, this yields $$\tfrac{1}{2}:1:1:0:-1:1:-\tfrac{1}{2}$$

This reveals that the central tapping may be dispensed with. In the case of digital signal transmission the very simple binary division by 2, as already explained with reference to FIG. 2*a*, should be employed again.

(ii) If n is selected to be 3, the ratios will be $$1:6:18:24:-18:6:-1 \quad (2)$$

If these numbers are multiplied by 4/3, the extreme values being rounded to 1 and −1 respectively, this yields $$1:8:24:32:-24:8:-1$$

The frequency response of the arrangement will hardly be influenced by the above-mentioned rounding. By again dividing by the greatest value that occurs, this results in $$1/32:\tfrac{1}{4}:\tfrac{3}{4}:1:-\tfrac{3}{4}:\tfrac{1}{4}:-1/32$$

This means that divisions by $4(=2^2)$ and $32(=2^5)$ are required, which in the case of a digital design of the arrangement, means shifting a binary number respectively 2 and 5 positions in the direction of the least significant bit. The division by 32 is illustrated in FIG. 2*b*. The 16-bit number denoted by 16 of FIG. 2*a*, divided by 32, yields the number denoted by 18 in FIG. 2*b* by shifting it through 5 positions.

(iii) Multiplying the numbers in the ratios in formula (2) by $\frac{2}{3}$ and again rounding the extreme values to 1 results in $$1:4:12:16:-12:4:-1$$

after which division by 16 yields $$1/16:\tfrac{1}{4}:\tfrac{3}{4}:1:-\tfrac{3}{4}:\tfrac{1}{4}:-1/16$$

Thus, divisions by $4(=2^2)$ and $16(=2^4)$ are employed, which in the case of a digital design of the arrangement means shifting the binary number 2 or 4 positions in the direction of the least significant bit.

(iv) Taking the value $1+\sqrt{2}$ for n and multiplying the values obtained after insertion in formula (1) by $$\frac{32}{6+4\sqrt{2}}$$

yields $$2.75:13.2:32:32:-32:13.2:2.75$$

Rounding the extreme values to 3 and the adjacent values to 13, which hardly affects the frequency response of the arrangement, and finally dividing the resulting numbers by the highest value, yields:

$$3/32:(13/32):1:1:-1:(13/32):-(3/32)$$

Thus, only divisions by 32 are necessary, i.e. in the case of digital processing: shifting through 5 positions in the direction of the least significant bit.

The arrangement as shown in FIG. 1 may alternatively be provided with 9 tappings. The ratios between the amplitudes of the signals at the outputs of the amplitude control devices will then be $$1:2n:2n^2:(n^3-n):\tfrac{1}{4}(n^4-1)-2n^2:-(n^3-n):2n^2:-2n:1$$

Again a small value is preferably selected for n. If n is selected to be 1, the ratios will be $$1:2:2:0:-2:0:2:-2:1$$

If these figures are divided by the highest value, this results in $$\tfrac{1}{2}:1:1:0:-1:0:1:-1:\tfrac{1}{2}$$

i.e. the tappings adjacent the central tapping may be dispensed with. Division by 2 is required for the two extreme tappings, i.e. a binary shift through one position in the direction of the least significant bit.

FIG. 3 shows an arrangement in accordance with the invention provided with two or more delay lines 21, 22,—each similar to that shown in FIG. 1. Each delay line may be provided with 5, 7 or 9 tappings. FIG. 3 shows a delay line 21 with 7 tappings and amplitude control devices giving factors $a_1$ to $a_7$, and a delay line 22 also having 7 tappings and amplitude control devices giving factors $b_1$ to $b_7$. The ratios between the amplitudes of the output signals of the amplitude control devices may differ for the two delay lines provided of course that they conform with expression (1). Similarly, the delays $t_1$ and $t_5$ respectively between the tappings of the two delay lines and the delays $t_0$ and $t_4$ respectively from the input to the first tappings of these delay lines may differ.

The output of the common adding circuit 23 of the first delay line 21 is connected to the input of the second delay line 22. The output of the common adding circuit 24 of the second delay line 22 is either connected to the input of the next delay line or, if only two delay lines are present, is connected to the output 15 of the arrangement.

In this way, longer delay times and more (if desired, non-equally spaced) delays (echoes) may be obtained, while maintaining the advantage of an arrangement with a flat frequency response.

FIG. 4 shows another arrangement comprising a series connection of five identical delay lines 31 to 35 provided with 5, 7 or 9 tappings. The ratios between the amplitudes at the outputs of the amplitude control devices associated with the tappings are the same for all delay lines. The output of the first delay line 31 is connected to the input of the second delay line 32. The input of each succeeding delay line is connected to the output of the delay line preceding it. The time interval between the central tappings of every two consecutive delay lines is $t_2$. The outputs of the common adding circuits 36 to 40 associated with respective ones of the delay lines 31 to 35 are each connected to the output 15 of the arrangement via second amplitude control devices, represented by the respective elements 41 to 45, and a further common adding circuit 46. The elements 41 to 45 amplify or attenuate the signals at the outputs of the common adding circuits 36 to 40 by respective factors $b_1$ to $b_5$, namely in such a way that the ratios between the amplitudes of the output signals of the second amplitude control devices 41 to 45, viewed from one end of the arrangement to the other end, are $1:2m:2m^2;-2m:1$. This arrangement has a substantially frequency-independent transmission characteristic. The arrangement may alternatively be equipped with 7 or 9 series connected delay lines each with 5, 7 or 9 tappings. The corresponding amplitudes on the outputs of the second amplitude control devices then are in the ratios $$1:2m:2m^2:m^3-m:-2m^2:2m:-1$$

for 7 delay lines and $$1:2m:2m^2:m^3-m:\tfrac{1}{4}(m^4-1)-2m^2:-(m^3-m):2m^2:-2m:1$$

for 9 delay lines.

The same possibilities exist for the ratios between the amplitudes at the outputs of the second amplitude control devices as have been described for the amplitude control devices of FIG. 1.

Figure 5:
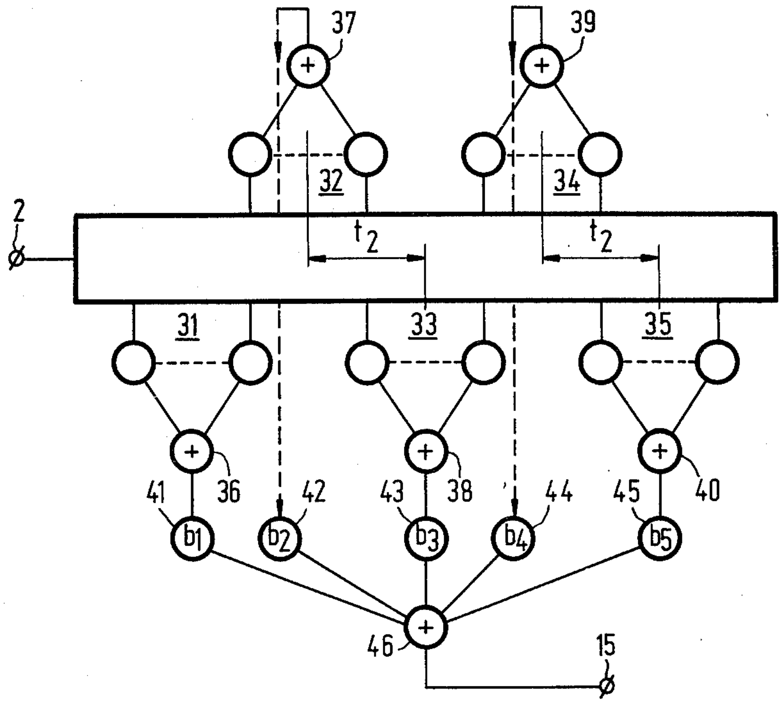
FIG. 5 shows another embodiment of the arrangement of FIG. 4.

In the arrangement of FIG. 5 the delay lines 31 to 35 of FIG. 4 are effectively interlaced in such a way that the delay $t_2$ occurring between the central tappings on two delay lines which are disposed "adjacent" each other is smaller than the sum of the delay occurring between the central tapping and the output of a given delay line and the delay occurring between the input and the central tapping of the next delay line. For the sake of clarity the tappings associated with the delay lines 32 and 34 are shown at the top of the delay line.

Figure 6:
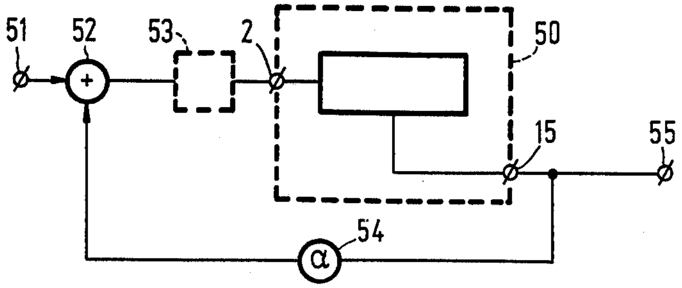
FIG. 6 shows a reverberation unit provided with an arrangement in accordance with the invention.

In order to obtain a reverberation unit with the aid of an arrangement in accordance with the invention, which arrangement in principle only supplies an output signal together with delayed versions thereof, i.e. a unit supplying a signal which recurs with an amplitude which decreases in time (corresponding to genuine echoes), the output signal of the arrangement should be fed back to its input. Such a reverberation unit is shown in FIG. 6. The framed part 50 represents the arrangement, which has an input 2 and an output 15. The framed part 50 may thus contain any of the embodiments of FIGS. 1, 3, 4 and 5. The arrangement 50 is preceded by a combination unit 52. Between the combination unit and the arrangement 50 an additional delay line 53 providing a fixed delay may be included. The input 51 of the reverberation unit is connected to a first input of the combination unit 52. The output 15 of the arrangement is connected to the output 55 of the reverberation unit and, as the case may be via a feedback amplifier 54, to a second input of the combination unit 52. In order to prevent instabilities from occurring in the reverberation unit the gain around the loop containing the combination unit 52, the delay line 53, the arrangement 50 and the feedback amplifier 54 should be smaller than unity, i.e. $A\alpha<1$, A being the gain of the arrangement 50 from input 2 to output 15 and assuming that the gains of delay line 53 and combination unit 52 are unity.

By selecting the factors $a_1$ to $a_5$, $a_7$ or $a_9$ and, if present, $b_1$ to $b_5$, $b_7$ or $b_9$, of the amplitude control devices in the arrangement 50 so that the gain A of the arrangement is smaller than unity, it is possible that a feedback amplifier 54 will not be required in the feedback circuit.

In an embodiment (not shown) of the reverberation unit of FIG. 6 the arrangement 50 comprises two delay lines having 7 tappings each, as shown in FIG. 3. With such a reverberation unit it is possible to obtain a very faithful simulation of three-dimensional reverberation, i.e. reverberation in a three-dimensional space such as a concert hall. By selecting the two time intervals quoted in FIG. 3 for the two delay lines to be different for the two lines, it is possible to obtain a desired increase in the "density" of the successive echoes, with a rapid square-law increase of the number of echoes per unit of time.

By merely feeding back the output signal to the input of the arrangement 50 a reverberation unit is obtained which is no longer frequency-independent, i.e. no longer exhibits a flat frequency response from input 51 to output 55. If in another embodiment of the reverberation unit, shown in FIG. 7, the arrangement 50 and, as the case may be, the preceding delay line 53 is bridged by a transmission path 56, in which an amplifier 57 may be included, which transmission path is connected to a first input of a further combination unit 58 in the form of an adder, and the output 15 of the arrangement 50, as the case may be via an amplifier 59, is connected to a second input of the further combination unit 58, a reverberation unit can be obtained which has a frequency-independent transmission characteristic from input 51 to output 55, which output is connected to the output of the further combination unit 58. For this the following requirement must be met: the gain around the loop containing the combination unit 52, the delay line 53, the arrangement 50 and the amplifier 54, should be equal to but of a sign opposite to the ratio of the gain from the input 51 to the output 55 via the combination unit 52 and the transmission path 56, and to the gain from the input 51 to the output 55 via the combination unit 52, the arrangement 50 and the amplifier 59, i.e. $A\alpha=-\beta/A\gamma$. In order to obtain a reverberation unit which, from input 51 to output 55, moreover has unity gain for the entire frequency range, the gain from input 51 to output 55 via the arrangement 50 should be selected equal to 1, i.e. $A\gamma=1$.

By selecting the factors $a_1$ to $a_5$, $a_7$ or $a_9$ and, as the case may be, $b_1$ to $b_5$, $b_7$ or $b_9$ of the amplitude control devices in the arrangement so that the gain A of the arrangement is equal to 1, no amplifier 59 need be included in the path from the output 15 to the second input of the further combination unit 58.

Figure 7:
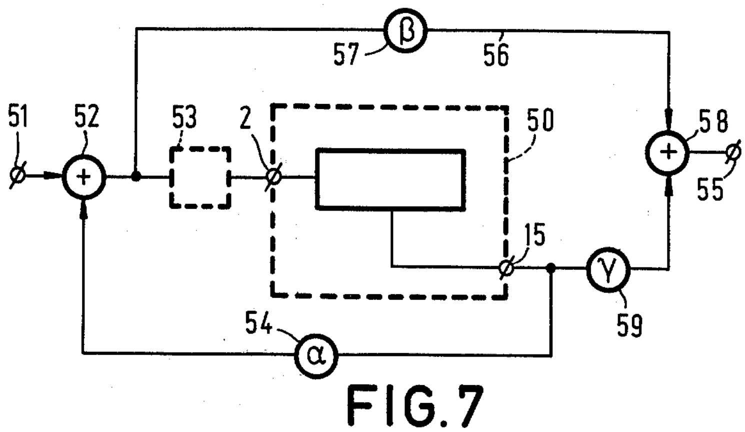
FIG. 7 shows a reverberation unit having a flat frequency response.
Figure 8:
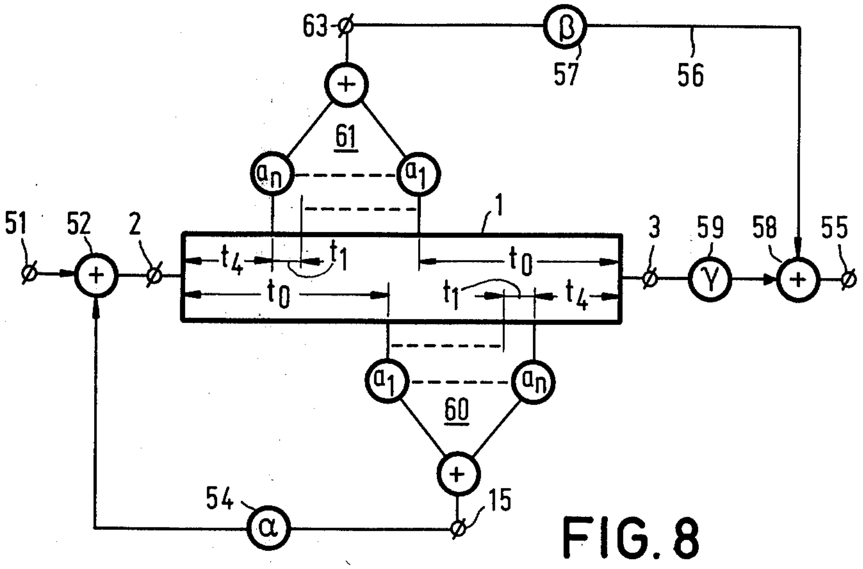
FIG. 8 shows another reverberation unit with a flat frequency response curve.

FIG. 8 shows a particular embodiment of the reverberation unit of FIG. 7. The 5, 7 or 9 tappings of the delay line, provided with respective amplitude control devices and an adder, and denoted by the reference numeral 60. The output 15 of the arrangement 60 is fed back to the second input of the combination unit 52 via a feedback amplifier 54. Unlike the reverberation unit of FIG. 7, the output 3 of the delay line is now connected to the second input of the further combination unit 58 via the amplifier 59. The reference numeral 61 denotes an equal number of tappings and associated amplitude control devices (together with an associated adder) to those shown for 60. The delays between the tappings of 60 and 61 are equal ($t_1$). The ratios between the amplitudes of the output signals of the amplitude control devices associated with the tappings of 60, viewed in a direction along the delay line, are the same as for the tappings of 61, but then viewed in a direction opposite to the said direction. The delay $t_0$ between the input of the delay line and the first tapping of 60 is equal to the delay between the last tapping of 61 and the end of the delay line 1. Similarly, the delay $t_4$ between the input of the delay line 1 and the first tapping of 61 is equal to the delay between the last tapping of 60 and the end of the delay line 1. Delay $t_4$ may be greater or smaller than or equal to $T_0$. Thus, 60 and 61 are arranged mirror-symmetrically relative to the centre of the delay line 1. The output 63 of the arrangement 61 is connected to the first input of the further combination unit 58 by means of the transmission path 56, which may include the amplifier 57. For frequency-independent transmission (flat frequency response) by the reverberation unit between the input 51 and the output 55 the gain around the loop containing the combination unit 52, the arrangement 60 and the feedback amplifier 54 should be equal to but of a sign opposite to the ratio of the gain from the input 51 to the output 55, via the arrangement 61 and the transmission path 56, to the gain from input 51 to the output 55 via the delay line 1 and the amplifier 59, i.e. $A\alpha=-B\beta/C\gamma$, B representing the gain from input 2 to the output 63 of the arrangement 61 and C the gain of the delay line 1 from input 2 to the output 3.

Also in this case the reverberation unit has unity gain from input 51 to output 55, if the gain from input 51 to output 55, via the delay line 1 is unity, i.e. $C\gamma=1$. If the gain C of the delay line 1 is made to be unity, no amplifier 59 need be included. Moreover, the factors $a_1$ to $a_5$, $a_7$ or $a_9$ given by the amplitude control devices in the arrangements 60 and 61, and thus the gain factors A and B, for the same ratios between the amplitudes of the output signals of the amplitude control devices of the two arrangements 60 and 61, may be selected so that no feedback amplifier 54 and/or amplifier 57 need be included in the reverberation unit.

Finally, it is to be noted that the invention is not limited to the embodiments shown in the Figures. The invention also relates to arrangements or reverberation units in which the ratios between the amplitudes of the output signals of the amplitude control devices has been selected in the reverse sequence or in which the design in respect of points which do not relate to the principle of the invention differs from the embodiments described.

What is claimed is:

1. An arrangement for the transmission of audio signals comprising, at least one delay line provided with an input, an output and $(2k+1)$ tappings (k being an integer and $2\leqq k\leqq 4$), said tappings being situated at equal time intervals $(t_1)$ and each connected to a common adding circuit via a first amplitude control device, the first amplitude control devices being connected to tappings situated symmetrically realtive to a central tapping so that the output signals of said first amplitude control devices have equal amplitude values and the phase shifts in the first amplitude control devices are the same, but the phase shift in one of every two of said first amplitude control devices situated at equal odd multiples of the time interval $(t_1)$ from the central tapping differ by 180° from that in the other and the amplitudes of said signals are selected so that the transmission by the arrangement is at least substantially frequency-independent, characterized in that when an index x (x being an integer $\leqq k+1$) is assigned to a number of tappings of the delay line with the index 1 being assigned to one of the extreme tappings, and consecutive indices being assigned to consecutive adjacent tappings, proceeding from said extreme tapping to the central tapping, with the highest index assigned to the central tapping, the ratios between the output signals of the amplitude control devices $A_x$ associated with said tappings, including their signs, satisfy the equation $A_1:A_2:A_3:A_4:A_5=1:2n:2n^2:n^3-n:\frac{1}{4}(n^4=1)-2n^2$.

2. An arrangement as claimed in claim 1, wherein the arrangement comprises at least two delay lines with the input of each consecutive delay line connected to the output of the common adding circuit of the delay line which precedes it.

3. An arrangement as claimed in claim 1 which comprises 21+1 series-connected identical delay lines (1 being an integer and $2\leqq 1\leqq 4$) with an input of each consecutive delay line connected to an output of the delay line preceding it and arranged to have a time interval $(t_2)$ between the central tappings of two consecutive delay lines, means coupling the outputs of the adding circuits of the $(21+1)$ delay lines individually to a plurality of second amplitude control devices, means connecting an output of each second amplitude control device to a further common adding circuit whereby output signals of the second amplitude control devices of delay lines disposed symmetrically realtive to a central delay line have equal amplitude values, the phase shifts in the second amplitude control devices being equal, but the phase shift in one of every two of the second amplitude control devices situated at equal odd multiples of the time interval $(t_2)$ from the central tapping of the central delay line differ by 180° from that in the other, and that when an index x (x being an integer $\leqq 1+1$) is assigned to a number of delay lines, the index 1 being assigned to one of the extreme delay lines, consecutive indices being assigned to consecutive adjacent delay lines, proceeding from said extreme delay line to the central delay line, and the highest index to the central delay line, the ratios between the output signals of the second amplitude control devices $B_x$ associated with said delay lines, including their signs, satisfy the equation $B_1:B_2:B_3:B_4:B_5=1:2m:2m^2:m^3-m:\frac{1}{4}(m^4-1)-2m^2$.

4. An arrangement as claimed in claim 3, characterized in that the $21+1$ delay lines are combined into one delay line having $21+1$ groups of $2k+1$ tappings.

5. An arrangement as claimed in claim 1, 2, 3 or 4, characterized in that for a said delay line n is equal to 1.

6. An arrangement as claimed in claim 1, 2, 3 or 4, characterized in that a said delay line comprises 7 tappings and that the output signals of the first amplitude control devices, viewed from one end of the delay line to the other end, are in the ratio of 1:8:24:32:−24:8:−1.

7. An arrangement as claimed in claim 1, 2, 3 or 4, characterized in that at least one delay line comprises 7 tappings and that the output signals of the first amplitude control devices, viewed from one end of the delay line to the other end, are in the ratio of 1:4:12:16:−12:4:−1.

8. An arrangement as claimed in claim 1, 2, 3 or 4, characterized in that at least one delay line comprises 7 tappings and that the output signals of the first amplitude control devices, viewed from one end of the delay line to the other end, are in the ratio of 3:13:32:32:−32:13:−3.

9. An arrangement as claimed in claim 3 or 4, characterized in that m is 1.

10. An arrangement as claimed in claim 3 or 4, characterized in that the arrangement comprises 7 delay lines and that the output signals of the second amplitude control devices, viewed from one end to the other end, are in the ratio of 1:8:24:32:−24:8:−1.

11. An arrangement as claimed in claim 3 or 4, characterized in that the arrangement comprises 7 delay lines and that the output signals of the second amplitude control devices, viewed from one end to the other end, are in the ratio of 1:4:12:16:−12:4:−1.

12. An arrangement as claimed in claim 3 or 4, characterized in that the arrangement comprises 7 delay lines and that the output signals of the second amplitude control devices, viewed from one end to the other end, are in the ratio of 3:13:32:32:−32:13:−3.

13. A reverberation unit comprising an arrangement as claimed in any of claims 1 to 4, a combination unit having first and second inputs and an output, means for applying a signal to the first input of the combination unit, means coupling the output of the combination unit to the input of the arrangement, and means connecting the output of the arrangement to the second input of the combination unit.

14. A reverberation unit as claimed in claim 13 wherein the arrangement comprises at least 2 delay lines with the input of each consecutive delay line connected to the output of the common adding circuit of the delay line which precedes it, each delay line provided with 7 tappings with the time interval between the tappings of one delay line being unequal to that of a second delay line, and the output of the common adding circuit of the second delay line constituting the output of the arrangement.

15. A reverberation unit as claimed in claim 13 further comprising means connecting the output of the combination unit to a first input of a further combination unit, and means connecting the output of the arrangement to a second input of the further combination unit, the output signal being available at an output of said further combination unit.

16. A reverberation unit as claimed in claim 13 wherein said arrangement includes one delay line with two identical groups of $2k+1$ tappings together with associated amplitude control devices and adding circuits, means connecting an output of a common adding circuit of the first group to the second input of the combination unit, means connecting an output of a common adding circuit of the second group to a first input of a further combination unit, the output of the delay line being connected to a second input of the further combination unit, said further combination unit having an output at which the desired signal is available, and wherein the ratios between the output signals of the amplitude control devices of the first group, viewed from the input of the delay line, are equal to the ratios between the output signals of the amplitude control devices of the second group, viewed from the output, and the time interval between the input of the delay line and the first tapping of the first group is equal to the time interval between the last tapping of the second group and the output of the delay line.

17. A reverberation unit as claimed in claim 14 further comprising means connecting the output of the combination unit to a first input of a further combination unit, and means connecting the output of the arrangement to a second input of the further combination unit, the output signal being available at an output of said further combination unit.

18. A reverberation unit comprising an arrangement as claimed in claims 1 or 2, a signal combining unit having first and second inputs and an output, means for applying an input signal to the first input of the combining unit, means coupling the output of the combining unit via a further delay line to an input of said arrangement, and means connecting an output of the arrangement via an amplifier to the second input of the combining unit.

19. A reverberation unit as claimed in claim 18, further comprising a second signal combining unit having first and second inputs and an output, means connecting the output of the first combining unit to the first input of the second combining unit via a second amplifier, and means connecting the output of the arrangement to said second input of the second combining unit via a third amplifier, the output of the second combining unit providing an output terminal of the reverberation unit.

20. A reverberation unit as claimed in claim 18, wherein said arrangement comprises two delay lines with the input of the second delay line connected to an output of the common adding circuit of the first delay line, and wherein each delay line comprises 7 tappings with the time intervals between the tappings of the first delay line being unequal to those of the second delay line, and an output terminal coupled to an output of the common adding circuit of the second delay line.

21. An arrangement as claimed in claim 1, comprising at least two delay lines wherein the values of n, k and $t_1$ for one delay line are identical to the values of n, k and $t_1$ for a second delay line, n being a number and $t_1$ the time interval between two adjacent tappings of a delay line.

22. An arrangement as claimed in claim 21, wherein n is equal to 1.

23. An arrangement as claimed in claim 1, comprising $21+1$ series connected identical delay lines with 1 having the value 2, 3 or 4, said delay lines having a time interval $t_2$ between the central tappings of any two consecutive delay lines, means connecting outputs of the common adding circuits of the delay lines to a further common adding circuit via individual second amplitude control devices, and wherein the ratios between the output signals of the second amplitude control devices $B_x$, including their signs, satisfy the relationship $B_1:B_2:B_3:B_4:B_5 = 1:2m:2m^3:m^2-m:\frac{1}{4}(m^4-1)-2m^2$, where m is a number.

* * * * *

UNITED STATES PATENT AND TRADEMARK OFFICE
CERTIFICATE OF CORRECTION

PATENT NO. : 4,375,623
DATED : March 1, 1983

INVENTOR(S) : NICO V. FRANSSEN ET AL

It is certified that error appears in the above-identified patent and that said Letters Patent is hereby corrected as shown below:

In the Claims:

Claim 1, line 6, delete "a" and insert --an individual-- line 28, change "$(n^4=1)$" to --$(n^4-1)$--

Claim 4, line 2, change "21+1" to --21+1-- line 3, change "21+1" to --21+1-- change "2k+1" to --2k+1-- line 11, change "$2m^3:m^2-m$" to --$2m^2:m^3-m$--

UNITED STATES PATENT AND TRADEMARK OFFICE
CERTIFICATE OF CORRECTION

PATENT NO. : 4,375,623

DATED : March 1, 1983

INVENTOR(S) : NICO V. FRANSSEN ET AL

It is certified that error appears in the above-identified patent and that said Letters Patent is hereby corrected as shown below:

In the Claims:

Please insert new claim 24 as follows:

--24. An arrangement as claimed in claim 1 comprising at least two said delay lines with a second delay line having an input connected to an output of the common adding circuit of the first delay line, and wherein one or more of the values n, k and $t_1$ for the first delay line are equal to the values n, k and $t_1$ for the second delay line, n being an integer and $t_1$ the time interval between two adjacent tappings of a delay line.--

On the title page "23 Claims" should read -- Claims 24 --.

Signed and Sealed this

*Fourth* Day of *June 1985*

[SEAL]

*Attest:*

DONALD J. QUIGG

*Attesting Officer* *Acting Commissioner of Patents and Trademarks*